United States Patent
Zizzo

(10) Patent No.: US 9,538,643 B2
(45) Date of Patent: Jan. 3, 2017

(54) COMPOSITE STRUCTURE AND RAFT FOR GAS TURBINE ENGINE

(71) Applicant: ROLLS-ROYCE PLC, London (GB)

(72) Inventor: Claudio Zizzo, Derby (GB)

(73) Assignee: ROLLS-ROYCE PLC, London (GB)

( * ) Notice: Subject to any disclaimer, the term of this patent is extended or adjusted under 35 U.S.C. 154(b) by 397 days.

(21) Appl. No.: 14/245,221

(22) Filed: Apr. 4, 2014

(65) Prior Publication Data

US 2014/0325995 A1 Nov. 6, 2014

(30) Foreign Application Priority Data

May 3, 2013 (GB) .................................. 1308021.3

(51) Int. Cl.
| | | |
|---|---|---|
| *H05K 1/02* | (2006.01) | |
| *C08K 3/04* | (2006.01) | |
| *C08K 7/06* | (2006.01) | |
| *F02C 7/00* | (2006.01) | |
| *F01D 5/28* | (2006.01) | |

(Continued)

(52) U.S. Cl.
CPC ............... *H05K 1/0298* (2013.01); *C08K 3/04* (2013.01); *C08K 7/06* (2013.01); *F01D 5/282* (2013.01);
(Continued)

(58) Field of Classification Search
CPC ............... C08K 3/04; C08K 3/08; C08K 7/04; C08K 7/06; F01D 5/282; F01D 17/24; F01D 25/24; F02C 7/00; F05D 2300/50; F05D 2300/224; F05D 2300/6012; F05D 2300/603; F05D 2300/614; H05K 1/02; H05K 1/0297; H05K 2201/09218; H05K 1/0298
(Continued)

(56) References Cited

U.S. PATENT DOCUMENTS

| | | | | |
|---|---|---|---|---|
| 6,246,012 B1 * | 6/2001 | Wallace | ................. | H01R 12/58 |
| | | | | 174/254 |
| 9,163,354 B2 * | 10/2015 | Shah | ...................... | B82Y 30/00 |

(Continued)

FOREIGN PATENT DOCUMENTS

| | | |
|---|---|---|
| EP | 1 505 696 A2 | 2/2005 |
| EP | 2 279 852 A1 | 2/2011 |

(Continued)

OTHER PUBLICATIONS

Dec. 2, 2013 British Search Report issued in British Application No. 1308021.3.

(Continued)

*Primary Examiner* — Bryon Gehman
(74) *Attorney, Agent, or Firm* — Oliff PLC

(57) ABSTRACT

A composite structure is provided. The structure is formed of rigid composite material in which non-metallic continuous fibers reinforce a polymer matrix. The continuous fibers are electrically conductive. The structure has electrodes electrically connected to the continuous fibers. The composite material contains one or more insulating barriers which electrically divide the structure so that a first portion of the material in electrical contact with one of the electrodes can be held at a different electrical potential to a second portion of the material in electrical contact with the other electrode. In use, an electrical unit can be provided to electrically bridge the first and second portions of the material such that electrical signals can be transmitted between the electrodes and the electrical unit via the continuous fibers.

12 Claims, 5 Drawing Sheets

(51) Int. Cl.
*F01D 17/24* (2006.01)
*F01D 25/24* (2006.01)

(52) U.S. Cl.
CPC .............. *F01D 17/24* (2013.01); *F01D 25/24* (2013.01); *F02C 7/00* (2013.01); *F05D 2300/224* (2013.01); *F05D 2300/50* (2013.01); *F05D 2300/603* (2013.01); *F05D 2300/6012* (2013.01); *F05D 2300/614* (2013.01); *H05K 2201/09218* (2013.01); *Y02T 50/672* (2013.01); *Y02T 50/673* (2013.01)

(58) Field of Classification Search
USPC ..................................... 60/801; 174/250–257
See application file for complete search history.

(56) References Cited

U.S. PATENT DOCUMENTS 9,313,884 B2 * 4/2016 Chabrecek ........... D03D 1/0088
2008/0182099 A1 * 7/2008 Lalli ....................... B32B 37/12
  428/327
2010/0163283 A1 * 7/2010 Hamedi ............... D03D 1/0088
  174/254
2016/0107739 A1 * 4/2016 Restuccia ................ C08K 3/08
  428/114

FOREIGN PATENT DOCUMENTS

| GB | 2 421 952 A | 7/2005 |
| GB | 2421952 A * | 7/2006 |
| WO | WO 2007/125282 A2 | 11/2007 |

OTHER PUBLICATIONS

Hou et al., "A resistance-based damage location sensor for carbon-fibre composites," *Smart Materials and Structures*, 2002, vol. 11, pp. 966-969.
Search Report issued in European Patent Application EP 14 16 2569 dated on Aug. 27, 2014.

* cited by examiner

COMPOSITE STRUCTURE AND RAFT FOR GAS TURBINE ENGINE

CROSS-REFERENCE TO RELATED APPLICATIONS

This application is based upon and claims the benefit of priority from British Patent Application Number 1308021.3 filed 3 May 2013, the entire contents of which is incorporated by reference.

BACKGROUND OF THE INVENTION

1. Field of the Disclosure

The present invention relates to a composite structure which can be used to transmit electrical signals.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 802, 804, each provided with a respective connector component 806, 808 for connection to circuitry, which may be for example accommodated within the airframe of an aircraft in which the engine is installed.

The harnesses 802, 804 are assembled from individual wires and cables which are held together over at least part of their lengths by suitable sleeving and/or braiding. Individual wires and cables, for example those indicated at 810, emerge from the sleeving or braiding to terminate at plug or socket connector components 812 for cooperation with complementary socket or plug connector components 814 on, or connected to, the respective electrical components.

Each conventional harness 802, 804 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated. Similarly, the exposed electrical connectors used to connect one conductor to another conductor or conductors to electrical units may be susceptible to damage and/or may add significant weight to the engine.

OBJECTS AND SUMMARY

It would be desirable to provide an alternative, and preferably simpler, way of transmitting electrical signals, and the present invention is at least partly based on a recognition that this can be achieved in a composite material structure by making use of the intrinsic electrical conductivity of reinforcement fibres of a composite material.

Accordingly, in a first aspect, the present invention provides a composite structure formed of rigid composite material in which non-metallic continuous fibres reinforce a polymer matrix, the continuous fibres being electrically conductive, and the structure having electrodes electrically connected to the continuous fibres, wherein the composite material contains one or more insulating barriers which electrically divide the structure so that a first portion of the material in electrical contact with one of the electrodes can be held at a different electrical potential to a second portion of the material in electrical contact with the other electrode, whereby, in use, an electrical unit can be provided to electrically bridge the first and second portions of the material such that electrical signals can be transmitted between the electrodes and the electrical unit via the continuous fibres.

Advantageously, the reinforcing fibres themselves can thus be used to transmit electrical signals, thereby potentially avoiding a need for separate and more complex signal transmission arrangements. The structure can also readily allow the addition of new electrical units or modification of their position. In addition, the structure can be electrically robust, having no single point of potential failure (unlike e.g. a wire).

In a second aspect, the present invention provides a gas turbine engine, having the composite structure of the first aspect.

Further optional features of the invention will now be set out. These are applicable singly or in any combination with any aspect of the invention.

The electrical signals can be power and/or communication signals.

The electrically conductive continuous fibres may be the primary or sole reinforcement fibres of the polymer matrix.

The electrically conductive continuous fibres may be carbon fibres.

The electrically conductive continuous fibres may be woven.

The electrically conductive continuous fibres may be in layers (e.g. woven layers) in the composite material.

The polymer matrix may be BMI (bismaleimide), PEEK (polyetheretherketone), PTFE (polytetraflouroethylene), PAEK (polyaryletherketone), polyurethane, and/or polyamides (such as nylon).

The one or more insulating barriers may be one or more insulating layers. For example, such insulating layers may be formed by further reinforcing continuous fibres, such as glass fibres. The insulating fibres can also be woven and/or layered.

The potential difference produced, in use, between the first and second portions can be in the range from 1 to 48 V.

The composite structure may further include a power source, such as a battery or generator, which supplies electrical power to the electrodes and can thereby power the electrical unit. However, another option is for the electrodes to belong to another electrical unit which can thereby transmit electrical signals to or receive electrical signals from the first electrical unit. More particularly, the composite structure may further include one or more electrical units, which electrically bridge the first and second portions of the material (e.g. each unit can have an electrode which connects to the continuous fibres in the first portion and an electrode which connects to the continuous fibres in the second portion). When the composite structure includes a plurality of such electrical units, they can thereby communicate with each other via the continuous fibres of the composite material.

The structure may be electrically divided by the barriers into three, four or more portions, each of which can be held at a different electrical potential to the other portions. Electrical units can then be provided to electrically bridge different portions (e.g. different pairs of portions). In this way, different groups of electrical units can have different communication channels or power supplies.

The composite structure may be for use on a vehicle.

For example, the composite structure may be a rigid raft for a gas turbine engine, wherein the raft has an electrical system in which metallic electrical conductors (typically surrounded by insulating sheathes, and optionally in the form a flexible printed circuit) are embedded in the composite material and/or the raft has a fluid system (for one or more fluid passages for carrying e.g. cooling gas or air, fuel, lubricant, or hydraulic liquid) embedded in the composite material. As discussed above, a conventional gas turbine engine has a substantial number of electrical components which are connected by wires and/or cables assembled together in a harness, which comprises a large number of components, including various individual wires and/or bundles of wires, supporting components (such as brackets or cables) and electrical and/or mechanical connectors. Disassembly of a conventional harnesses can be complicated and/or time consuming. Further, the electrical conductors in a conventional harness may be susceptible to mechanical damage. However, an electrical rigid raft can provide a number of advantages over a conventional harness. For example, during assembly and in use, such rafts may provide greater protection to their electrical conductors than conventional harnesses. In addition, the use of such rafts may significantly reduce the build and maintenance times of an engine, and/or reduce the possibility of errors occurring during such procedures. The rafts can also provide weight and size advantages over conventional harnesses. Similar advantages can accrue when fluids are transferred using the embedded fluid system of the rigid raft. Conveniently, when the rigid raft has an electrical system, relatively high power electrical units can be electrically connected to the electrical system, while relatively low power electrical units can be electrically connected to the electrodes (i.e. by electrically bridging the first and second portions of the material so that electrical signals can be transmitted between the electrodes and the low power electrical units via the continuous fibres).

More generally, modern aircraft make increasing use of composite material for panels and surfaces. On engine there are a number of sensors, actuators and electronic units that require electrical power. Such units may also need to communicate. For example sensors may need to send data signals to an electronic control unit (e.g. a FADEC electronic engine control or an engine health monitoring unit) and the unit may need to send control signals to actuators to control valves, electric motors etc. Some of these signals can conveniently be sent via the continuous fibres of the composite material.

It will be appreciated that any embedded electrical conductors (whether they are provided as embedded electrical wires or as conductive tracks in a flexible printed circuit embedded in the rigid material) may be described as being fixed in position by the rigid material, for example relative to the rest of the electrical harness raft. It will also be appreciated that embedded electrical conductors may be said to be surrounded by the rigid material and/or buried in the rigid material and/or integral with (or integrated into) the rigid material.

Further optional features of the invention are set out below.

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 1:
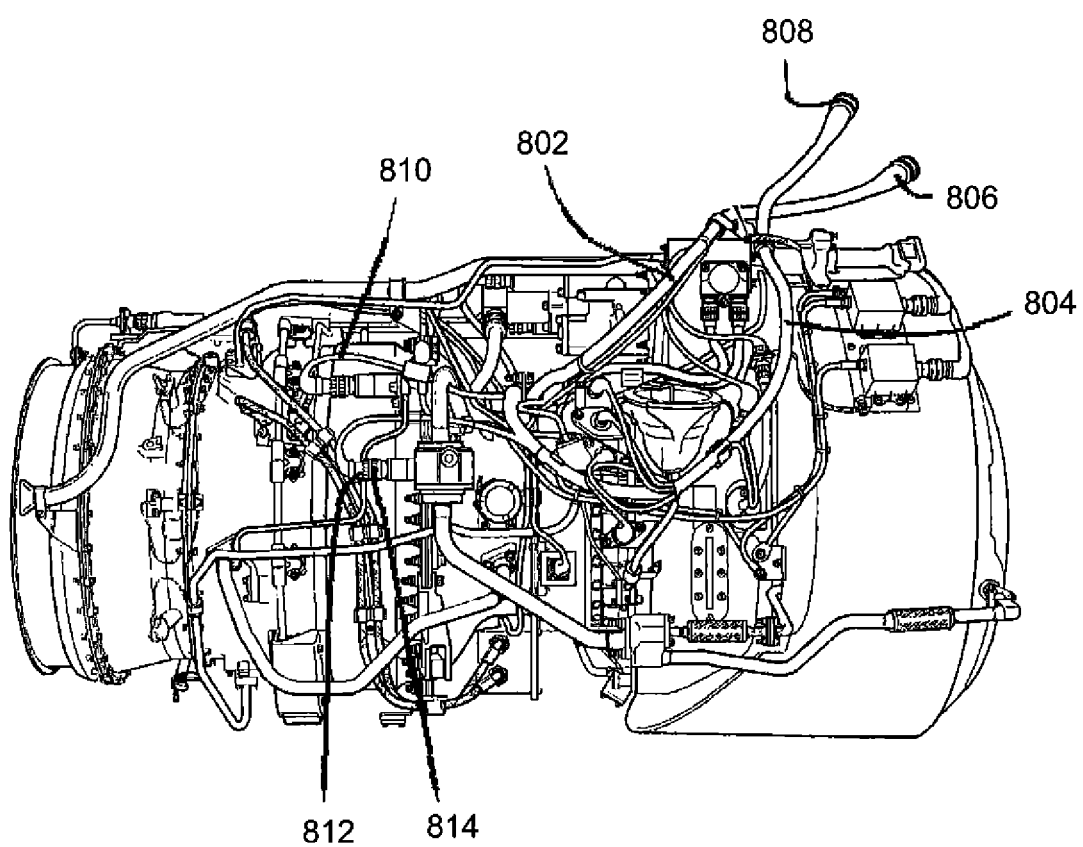
FIG. 1 shows a gas turbine engine with a conventional harness.
Figure 2:
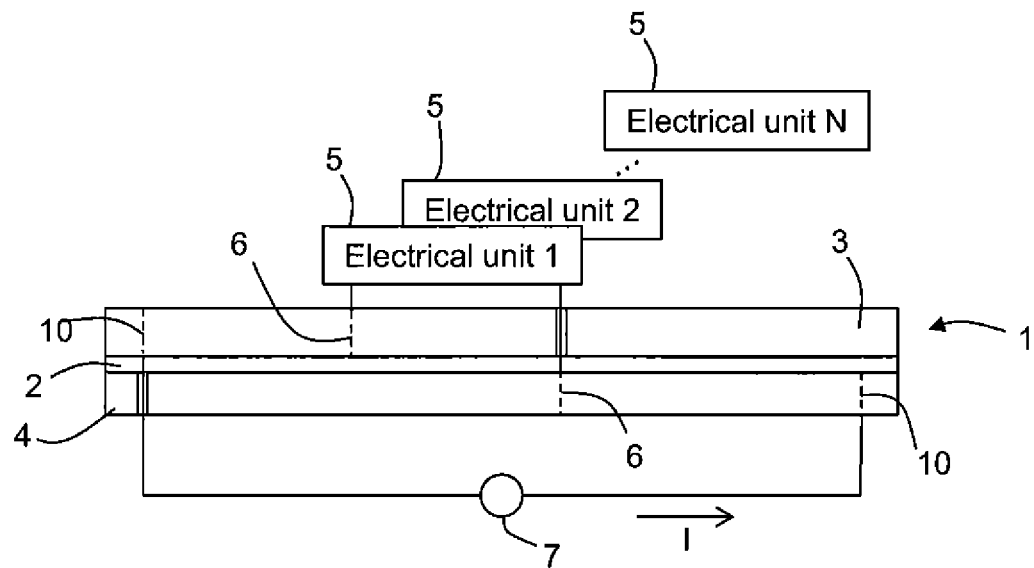
FIG. 2 shows schematically a side view of a panel formed of rigid composite material.

FIG. 2 shows schematically a side view of a panel 1 formed of rigid composite material. The panel may part of a vehicle. The primary function of the panel may be mechanical (for example structural) and/or aerodynamic. The panel may thus be an internal or external panel, i.e. it may or may not be exposed to external airflow in use.

The composite material has a polymer matrix reinforced by non-metallic, but electrically conductive, continuous fibres, such as carbon fibres. The panel is divided into an upper portion 3 and a lower portion 4, the two portions being electrically isolated from each other by a barrier layer 2. The barrier layer may contain insulating continuous reinforcing fibres, such as glass fibres. The upper and lower portions can, therefore, be held at different electrical potentials.

One or more electrical units 5 each have electrodes 6 by which the units electrically bridge the upper 3 and lower 4 portions, the electrodes 6 connecting to the continuous fibres in each portion. Each unit 5 can thus receive electrical communication signals from or transmit such signals to other of the units 5 via the continuous fibres.

However, the upper and lower portions may have further electrodes 10 which connect to the continuous fibres in each portion 3, 4. A power source 7, such as a generator or battery, can then supply electrical power to the units 5 via the further electrodes 10 and the continuous fibres in each portion. A current I, which can be AC or DC, thus flows to each unit around a circuit which includes the continuous fibres of the upper 3 and lower 4 portions.

Additionally or alternatively, the units 5 can receive electrical communication signals from or transmit such signals to the other electrical components (not shown) via the further electrodes 10.

A typical surface resistance of the composite material in the upper 3 and lower 4 portions may be in the range from 100 mΩ to 10Ω. Due to the typically high impedance between the power source 7 and the units 5, the units should generally draw limited currents to reduce resistive losses and voltage drops.

The potential difference between the upper 3 and lower 4 portions can be just a few volts (e.g. 1.8V to 10 V) for low power electrical units such as sensors, to 24 V to 28 V for higher power electrical units e.g. for driving actuators. Even higher potential differences are possible (e.g. around 115 V), but may have safety implications.

Advantageously, the units 5 can be located at arbitrary positions on the outer surface of the upper portion 3, providing e.g. flexibility to add extra units as required. Further, fault tolerance can be improved by a reduced likelihood of single point (e.g. broken wire) failure.

Figure 3:
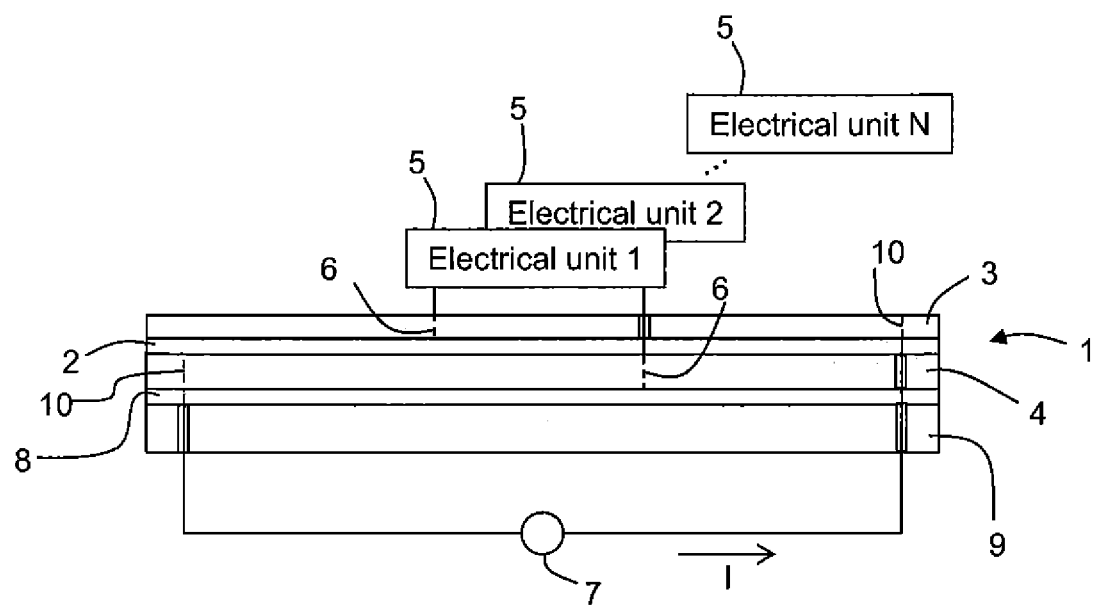
FIG. 3 shows schematically a side view of a further panel formed of rigid composite material.

FIG. 3 shows schematically a side view of a further panel 1 formed of rigid composite material. The panel is similar to the panel of FIG. 2, but is thicker and includes a second barrier layer 8 of insulating continuous reinforcing fibres, which is located beneath the lower portion 4 of the panel, and electrically divides the lower portion from a base portion 9. As illustrated, the upper 3 and lower 4 portions of the panel are held at different electrical potentials and are used to transmit electrical signals between the further electrodes 10 and the electrical units 5 and/or between the units themselves via the continuous fibres of these portions. The base portion is isolated from the upper and lower portions, and can be used, e.g. to contain an earthing mesh, protecting the panel against electrical interference/surges. Further, the base portion can be joined to other components, and current carried by the upper and lower portions can thus be prevented from short circuiting though those components.

However, although not shown in FIG. 3, other arrangements are possible. For example, the base portion 9 can have a respective further electrode 10, and the three portions 3, 4, 9 can all be held at different potentials with electrical units bridging different portions depending on the electrical and communication requirements of the individual units. Similarly, different power sources 7 can be used for different pairs of portions.

In FIGS. 2 and 3, the panel 1 is shown as a flat structure. However, more complicated structures can be used. For example, a cylindrical composite structure (such as e.g. a gas turbine engine nacelle) can be used to transmit electrical signals.

Figure 4:
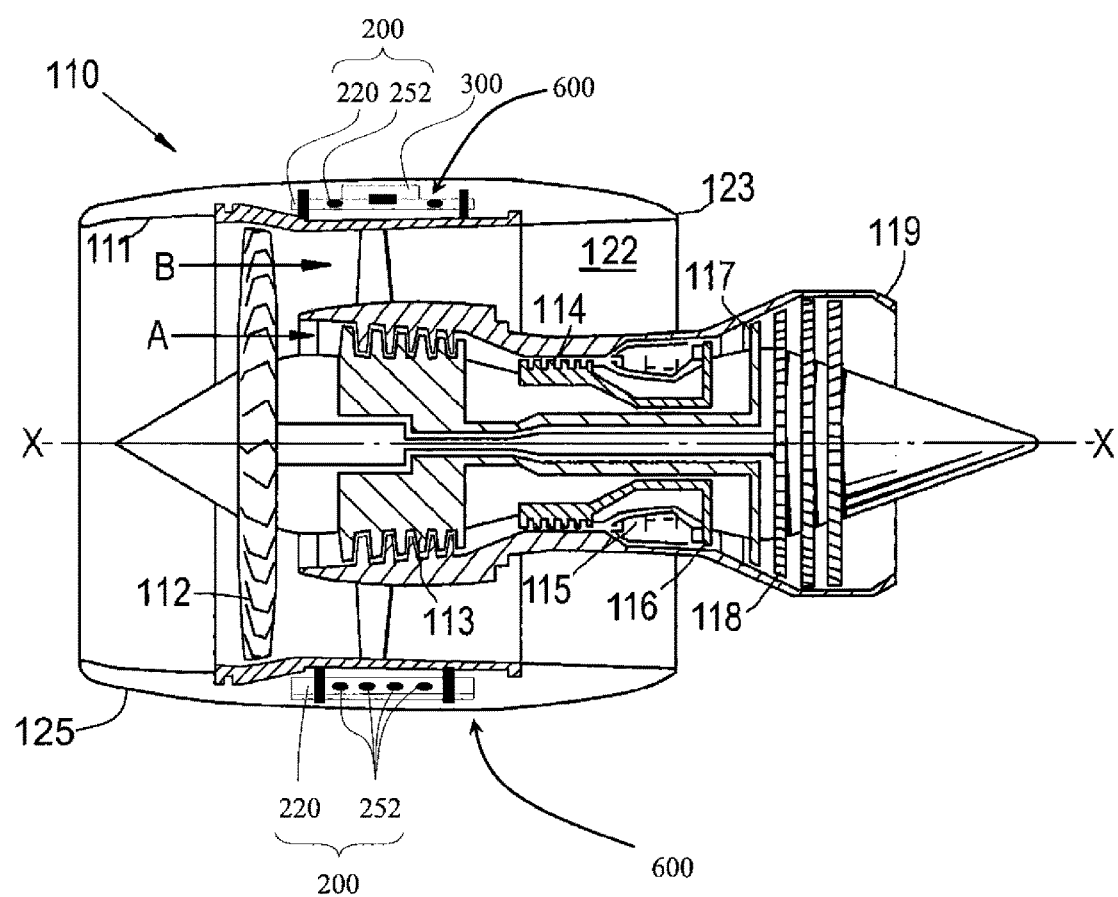
FIG. 4 shows a cross-section through a gas turbine engine in accordance with the present invention.

As indicated above, the composite structure can be a component of a gas turbine engine. With reference to FIG. 4, a ducted fan gas turbine engine generally indicated at 110 has a principal and rotational axis X-X. The engine 110 comprises, in axial flow series, an air intake 111, a propulsive fan 112, an intermediate pressure compressor 113, a high-pressure compressor 114, combustion equipment 115, a high-pressure turbine 116, and intermediate pressure turbine 117, a low-pressure turbine 118 and a core engine exhaust nozzle 119. The engine also has a bypass duct 122 and a bypass exhaust nozzle 123.

The gas turbine engine 110 works in a conventional manner so that air entering the intake 111 is accelerated by the fan 112 to produce two air flows: a first air flow A into the intermediate pressure compressor 113 and a second air flow B which passes through the bypass duct 122 to provide propulsive thrust. The intermediate pressure compressor 113 compresses the air flow A directed into it before delivering that air to the high pressure compressor 114 where further compression takes place.

The compressed air exhausted from the high-pressure compressor 114 is directed into the combustion equipment 115 where it is mixed with fuel and the mixture combusted. The resultant hot combustion products then expand through, and thereby drive the high, intermediate and low-pressure turbines 116, 117, 118 before being exhausted through the nozzle 119 to provide additional propulsive thrust. The high, intermediate and low-pressure turbines 116, 117, 118 respectively drive the high and intermediate pressure compressors 114, 113 and the fan 112 by suitable interconnecting shafts.

The composite structure can be, for example, the nacelle 125 which forms the outer aerodynamic surface of the engine.

However, the gas turbine engine 110 shown in FIG. 4 also has two electrical raft assemblies 600 which can be according to the invention. Each electrical raft assembly 600 comprises an electrical raft 200.

In FIG. 4, each electrical raft 200 (which may be referred to herein simply as a raft 200 or an electrical harness raft 200) comprises at least one metallic electrical conductor 252 embedded in a rigid composite material 220. The electrical conductors 252 may be in the form of a flexible printed circuit board (or FPC) 250. The electrical conductors 252 may be used to transmit/transfer electrical signals (or electricity, including electrical power and/or electrical control signals) around the engine and/or to/from the engine 110 from other components, such as components of an airframe.

However, in addition, the composite material of the raft 200 can itself be used to transmit electrical signals between electrical units 300 and electrodes which are electrically connected to conductive continuous reinforcing fibres of the composite material, as described above in relation to FIGS. 2 and 3.

In general, high power requirement units and/or units requiring many connections (such as an electronic engine control unit and an engine health monitoring unit) may communicate and receive power via the metallic electrical conductors 252 of the raft 200, while low power requirement units and/or units requiring few connections (such as sensors and actuators) may communicate and receive power via the composite material of the raft. Indeed a unit may use both the metallic electrical conductors (e.g. for power supply) and the composite material of the raft (e.g. for transmission of control or data signals).

Figure 5:
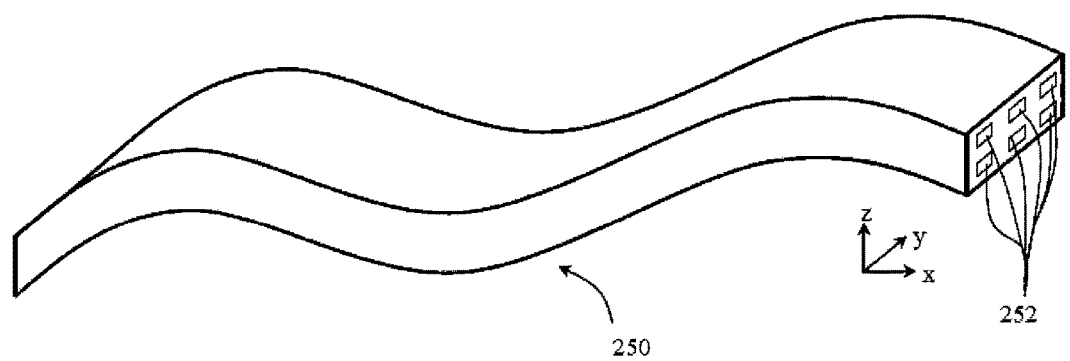
FIG. 5 shows a perspective view of a flexible printed circuit.
Figure 6:
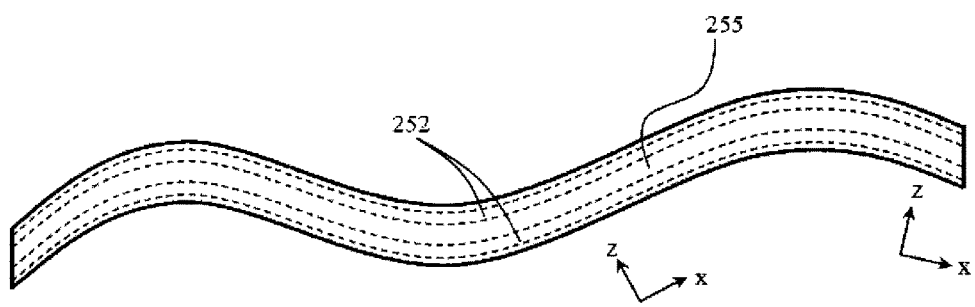
FIG. 6 shows a side view of the flexible printed circuit of FIG. 5.

An example of an FPC 250 in which the metallic electrical conductors 252 may be provided is shown in greater detail in FIGS. 5 and 6. FIG. 5 shows a perspective view of the FPC 250, and FIG. 6 shows a side view.

Such an FPC 250 may comprise a flexible (for example elastically deformable) substrate 255 with conductive tracks 252 laid/formed therein. The FPC 250 may thus be deformable. The FPC 250 may be described as a thin, elongate member and/or as a sheet-like member. Such a thin, elongate member may have a major surface defined by a length and a width, and a thickness normal to the major surface. In the example shown in FIGS. 5 and 6, the FPC 250 may extend along a length in the x-direction, a width in the y-direction, and a thickness (or depth or height) in the z-direction. The x-direction may be defined as the axial direction of the FPC. Thus, the x-direction (and thus the z-direction) may change along the length of the FPC 250 as the FPC is deformed. This is illustrated in FIG. 6. The x-y surface(s) (i.e. the surfaces formed by the x and y directions) may be said to be the major surface(s) of the FPC 250. In the example shown in FIGS. 5 and 6, the FPC 250 is deformable at least in the z direction, i.e. in a direction perpendicular to the major surface. FPCs may be additionally of alternatively deformable about any other direction, and/or may be twisted about any one or more of the x, y, or z directions.

The flexible substrate 255 may be a dielectric. The substrate material may be, by way of example only, polyamide. As will be readily apparent, other suitable substrate material could alternatively be used. The conductive tracks 252, which may be surrounded by the substrate 255, may be used to conduct/transfer electrical signals (including electrical power and electrical control signals) through the rigid raft assembly (or assemblies) 200, for example around a gas turbine engine 110 and/or to/from components of a gas turbine engine and/or an airframe attached to a gas turbine engine.

An electrical raft 200 may be manufactured using any suitable method. For example, the rigid material 220 may initially be provided as layers of flexible material, such as (by way of example only) layers of fibre and resin compound. This flexible material may be placed into a mould, for example having a desired shape. Other components (such as fluid pipes 210 and/or the electrical conductors 252, which may be embedded in a FPC 250) may also be placed into the mould, for example between layers of the flexible material from which the rigid material 220 is ultimately formed. Parts of the mould may have any suitable form and/or construction, for example that could be readily removed when the electrical raft 200 is formed into the desired shape.

Figure 7:
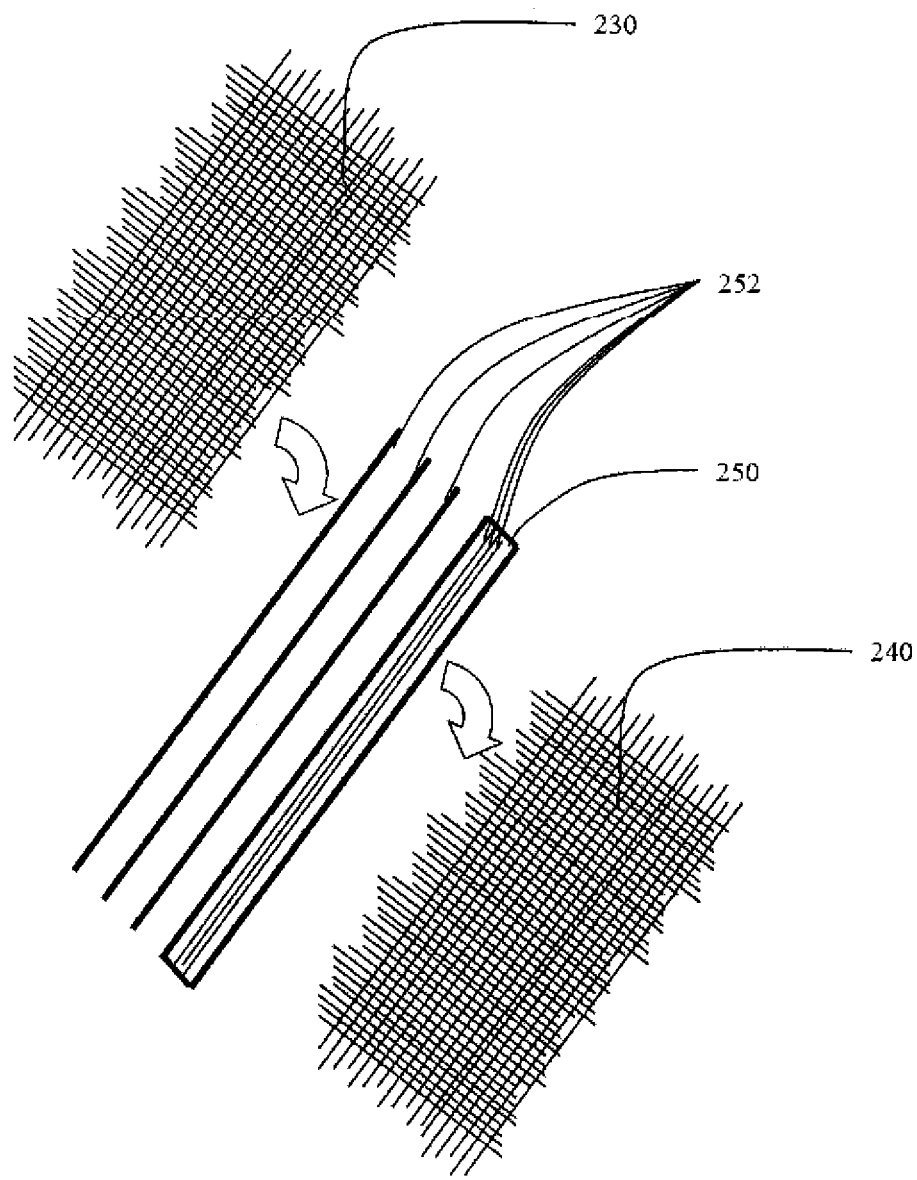
FIG. 7 shows a schematic of an electrical raft prior to assembly.

FIG. 7 shows components of an example of an electrical raft 200 prior to one method of construction. The metallic electrical conductors 252 are provided between two layers of material 230, 240 that, after construction, form the rigid material 220. Some of the electrical conductors 252 are provided in an FPC 250. The material 230, 240 may be a fibre and resin compound. Such a fibre and resin compound may, after suitable treatment (for example heat treatment), produce the rigid composite material 220. In the example of FIG. 7, the fibre and resin compound is formed of a sheet of interwoven fibres, or strands. The strands in FIG. 7 extend in perpendicular directions, although the strands may extend in any one or more directions as required. The strands/fibres may be pre-impregnated (or "pre-pregged") with the resin. The strands/fibres are conductive (e.g. they can be formed of carbon fibre) so that, with reference to FIGS. 2 and 3, they can carry the electrical signals between the electrical units 5 and the electrodes 6, 10, which can also be embedded in the raft.

Prior to any treatment, both the first and second layers 230, 240 and the electrical conductors 252 may be flexible, for example supple, pliable or malleable. As such, when the layers 230, 240 and the electrical conductors 252 are placed together, they may be moulded, or formed, into any desired shape. For example, the layers 230, 240 and the electrical conductors 252 may be placed into a mould (which may be of any suitable form, such as a glass or an aluminium mould) having the desired shape. The desired shape may be, for example, a shape that corresponds to (for example is offset from) a part of a gas turbine engine, such as, by way of example only, at least a part of a casing, such as an engine fan casing or engine core casing. This may enable the final raft to adopt shapes that are curved in two-dimensions or three-dimensions.

Any suitable method could be used to produce the electrical raft 200, or indeed any composite structure described herein. For example, the strands/fibres need not be pre-impregnated with the resin. Instead, the fibres/strands could be put into position (for example relative to electrical conductors 252/FPC 250) in a dry state, and then the resin could be fed (or pumped) into the mould. Such a process may be referred to as a resin transfer method.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

I claim:

1. A gas turbine engine comprising a composite structure formed of rigid composite material in which non-metallic continuous fibres reinforce a polymer matrix, the continuous fibres being electrically conductive, and the structure having electrodes electrically connected to the continuous fibres, wherein the composite material contains one or more insulating barriers which electrically divide the structure so that a first portion of the material in electrical contact with one of the electrodes can be held at a different electrical potential to a second portion of the material in electrical contact with another one of the electrodes, whereby, in use, an electrical unit can be provided to electrically bridge the first and second portions of the material such that electrical signals can be transmitted between the electrodes and the electrical unit via the continuous fibres.

2. A gas turbine engine according to claim 1, wherein the electrical signals are at least one of power and communication signals.

3. A gas turbine engine according to claim 1, wherein the electrically conductive continuous fibres are the primary reinforcement fibres of the polymer matrix.

4. A gas turbine engine according to claim 1, wherein the electrically conductive continuous fibres are the sole reinforcement fibres of the polymer matrix.

5. A gas turbine engine according to claim 1, wherein the electrically conductive continuous fibres are carbon fibres.

6. A gas turbine engine according to claim 1, wherein the one or more insulating barriers are formed by layers of further reinforcing continuous fibres.

7. A gas turbine engine according to claim 1, further including a power source which supplies electrical power to the electrodes and can thereby power the electrical unit.

8. A gas turbine engine according to claim 1, further including one or more electrical units, which electrically bridge the first and second portions of the material.

9. A gas turbine engine according to claim 8, including a plurality of the electrical units, each unit providing an electrode in electrical contact with the first portion and an electrode in electrical contact with the second portion, whereby electrical signals can be transmitted between the electrical units via the continuous fibres.

10. A gas turbine engine according to claim 1, which is for use on a vehicle.

11. A rigid raft for a gas turbine engine comprising a composite structure formed of rigid composite material in which non-metallic continuous fibres reinforce a polymer matrix, the continuous fibres being electrically conductive, and the structure having electrodes electrically connected to the continuous fibres, wherein the composite material contains one or more insulating barriers which electrically divide the structure so that a first portion of the material in electrical contact with one of the electrodes can be held at a different electrical potential to a second portion of the material in electrical contact with another one of the electrodes, whereby, in use, an electrical unit can be provided to electrically bridge the first and second portions of the material such that electrical signals can be transmitted between the electrodes and the electrical unit via the continuous fibres, and wherein the raft has at-least one of an electrical system in which metallic electrical conductors are embedded in the composite material and a fluid system embedded in the composite material.

12. A rigid raft for a gas turbine engine according to claim 11, comprising the electrical system in which metallic electrical conductors are embedded in the composite material, and further comprising:

a first electrical unit that electrically bridges the first and second portions of the material; and a second electrical unit that is electrically connected to the embedded metallic connectors, wherein:

the first electrical unit requires a lower operating power than the second electrical unit.

* * * * *